INVENTOR.
ARPAD SOMLYODY
BY
Robert A. Green
ATTORNEY

Aug. 8, 1967 A. SOMLYODY 3,335,266

ELECTRONIC COUNTER USING SEMICONDUCTOR COUNTING DEVICES

Filed Dec. 13, 1963 2 Sheets-Sheet 2

INVENTOR.
ARPAD SOMLYODY
BY Robert A. Green
ATTORNEY

United States Patent Office 3,335,266

Patented Aug. 8, 1967

3,335,266

ELECTRONIC COUNTER USING SEMICONDUCTOR COUNTING DEVICES

Arpad Somlyody, Raritan, N.J., assignor to Burroughs Corporation, Detroit, Mich., a corporation of Michigan Filed Dec. 13, 1963, Ser. No. 330,307
12 Claims. (Cl. 235—92)

ABSTRACT OF THE DISCLOSURE

The disclosure is of a counting circuit which includes a series of counting transistors each having base (input), emitter, and collector (output) electrodes. Each output is connected through a diode to the input of all but the next adjacent transistor in the counting series so that an "on" transistor can hold "off" all but the next adjacent transistor. Each output is also connected through a diode to its own input to prime it to receive an input pulse and through a coupling capacitor to the next adjacent transistor to turn on the next transistor. An input pulse source is coupled to all of the inputs of the transistors, and the circuit connections permit each transistor in turn to register a count as counting pulses are received.

Figure 1:
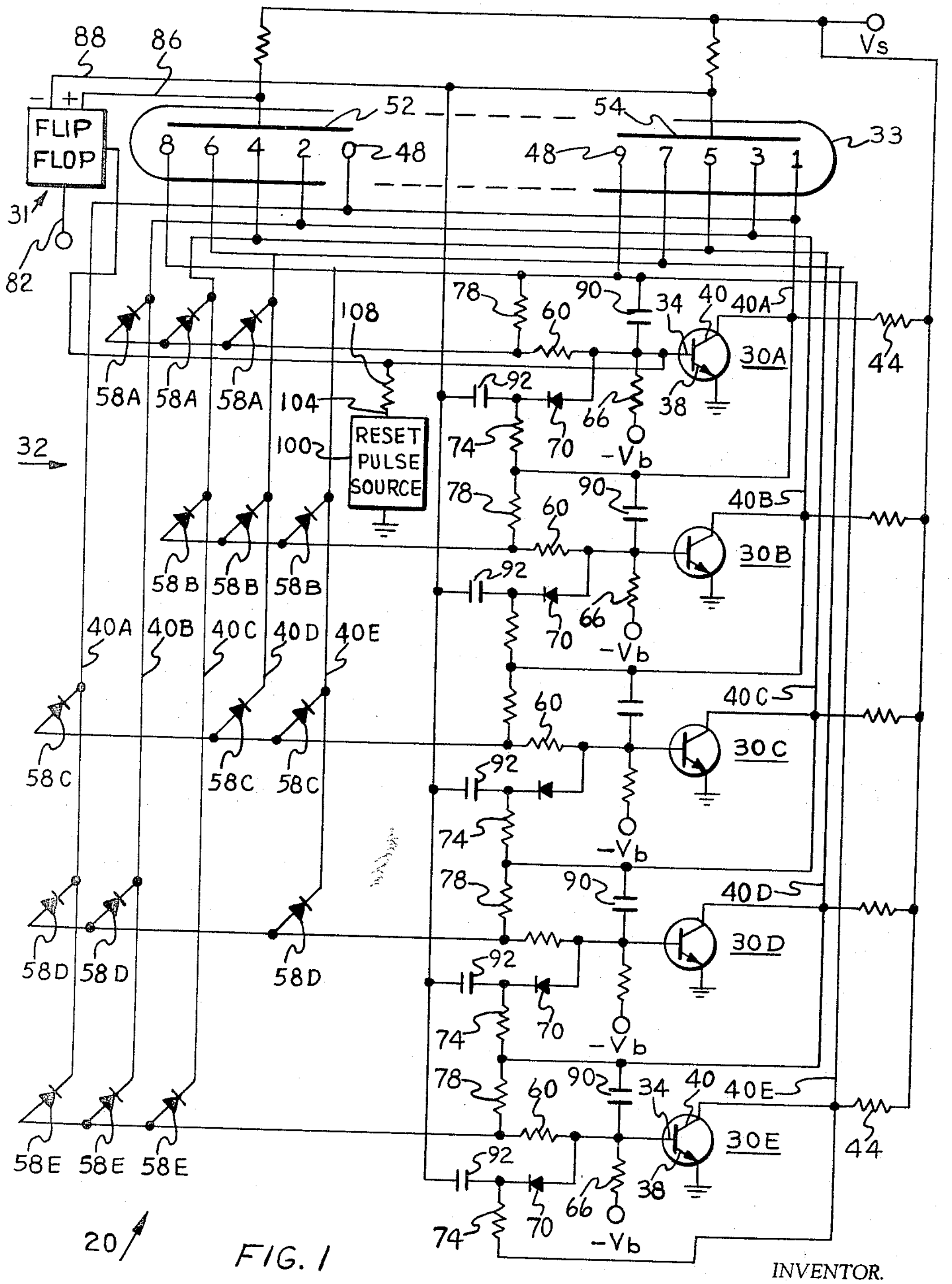

This invention relates to electronic counter circuits and particularly to semiconductor counter circuits which include a diode matrix and which operate with binary logic elements and binary-type readout devices to provide decimal readout.

This application is a continuation-in-part of application Ser. No. 181,731, filed Mar. 22, 1962, now Patent No. 3,119,950.

One type of electronic semiconductor counter recently devised utilizes a diode matrix to feed counting signals to a plurality of transistors, or the like, one transistor being provided for each counting step to provide digitial or decimal output logic. Such a circuit can be coupled directly to a decimal readout or indicator device to provide a direct visual indication of the counting operation. In this case, the readout device has one indicator element for each transistor or other source of signal information. This type of circuit operates quite satisfactorily.

The circuit of the present invention combines binary circuit logic with a binary indicator device to provide decimal readout of the counting operation. Such a counting circuit has fewer components and is generally simpler in construction than prior art decimal counting circuits.

The objects of the present invention concern the prosion of a semiconductor counter utilizing a diode matrix and providing decimal readout from the combination of a binary logic counting circuit and a binary readout device.

The objects of the invention also concern the provision of an improved coupling arrangement between the counting steps of a semiconductor counting circuit.

Briefly, a counter circuit embodying the invention includes a cold cathode gaseous indicator tube having two anodes and a plurality of cathodes which are connected in pairs to provide two sets of cathodes, each set being associated with one of the anodes. A discharge device, which operates in the nature of a switch, is provided to control the operation of each pair of cathodes, and an auxiliary control means is provided for operating each discharge device and the anodes of the indicator tube. Thus, the control means operates through each discharge device to determine which pair of cathodes is energized and through the anodes of the indicator tube to determine which cathode of each pair is caused to glow.

The discharge devices are adapted to be energized to assume a unique state of conduction; that is, they may be turned either on or off to operate the pairs of cathodes. Circuit means are provided by which each discharge device, when it is turned on or off, holds all of the other discharge devices in the opposite state. In addition, the circuit connections insure that the counting operation proceeds automatically in the correct direction and in the correct order from one discharge device to the next.

Figure 2:
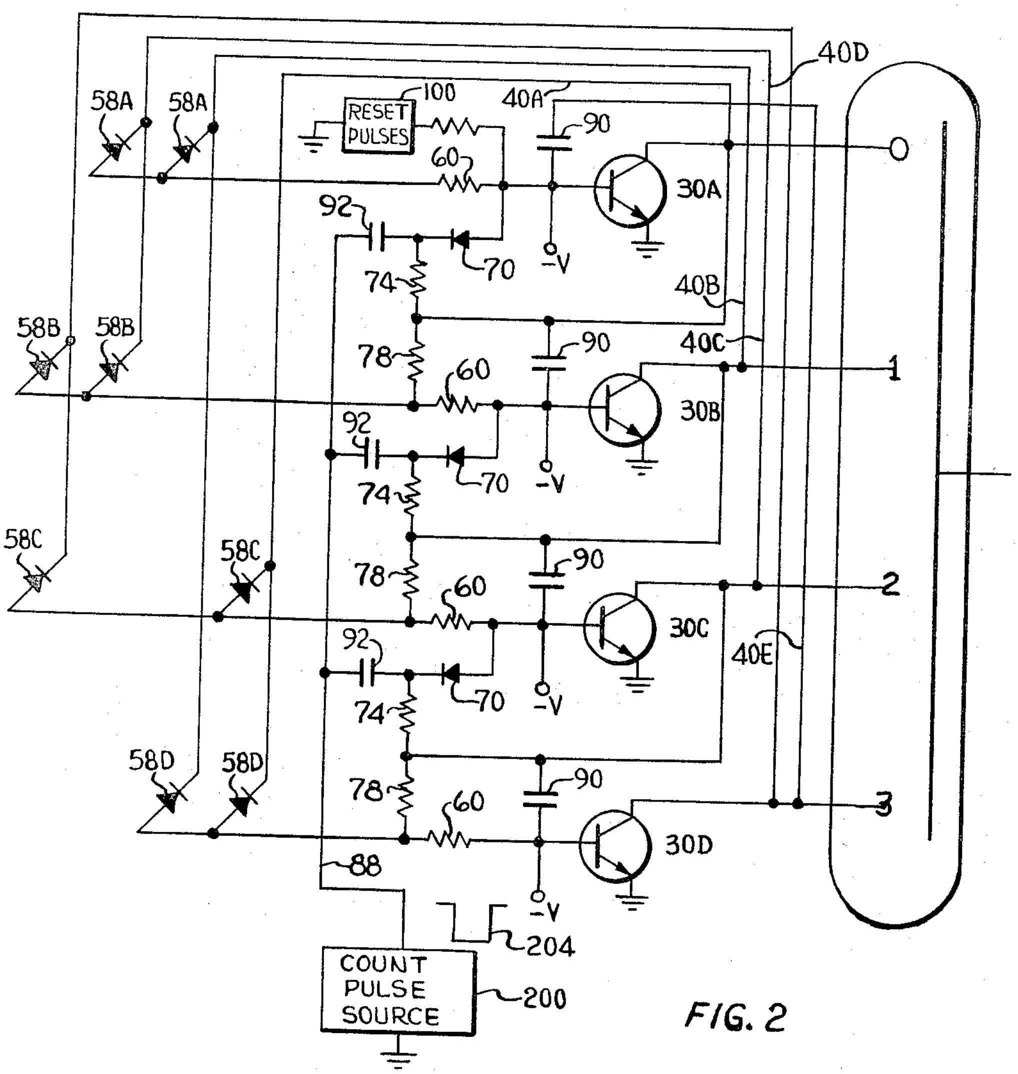

The invention is described in greater detail by reference to the drawing wherein:

FIG. 1 is a schematic representation of a counter circuit embodying the invention; and FIG. 2 is a schematic representation of a modification of a portion of FIG. 1.

The principles of the present invention are described below with reference to a decade counter which, to provide a cycle of ten counts, includes five circuit logic elements which operate in the nature of switches and perform a binary type of operation. The switch elements are electron discharge devices, preferably semiconductor devices, which are coupled to a readout device having five pairs of indicating elements. In other words, a biquinary semiconductor circuit drives a binquinary indicator device. It will be clear to those skilled in the art that the circuit may include substantially any number of logic elements and the indicator device may include any corresponding number of pairs of indicator elements.

Referring to FIG. 1, a decade counter circuit 20 embodying the invention includes five electron discharge devices, 30A, 30B, 30C, 30D, 30E, such as transistors, which receive separate counting pulses from a flip-flop 31 and are interrelated through a diode matrix 32. The transistors are shown and described as NPN transistors, but PNP or other transistors might also be used. The transistors are coupled to a binquinary indicator tube 33 which provides a decimal representation of the counting operation, and it is assumed that the counting operation proceeds in order from transistor 30A to 30B to 30C, etc.

Each transistor has base, emitter, and collector electrodes, 34, 38 and 40, respectively, and in each transistor, the emitter electrode 38 is connected to reference potential such as ground, and the collector electrode 40 is connected through a suitable bias resistor 44 to a source of positive D.C. bias potential *Vs*. Each collector electrode is also connected to the indicator tube 33. Since biquinary output signals are provided by the transistors 30, a biquinary indicator tube of the type described and claimed in U.S. Patent No. 2,906,906 is employed to provide the desired conversion to decimal readout. The tube 33 contains a plurality of cold cathode indicator electrodes 48, including the numerals zero to nine, which are electrically connected in two sets, with numerically adjacent cathodes being connected together. Thus, numeral electrodes 0 and 1 are connected together, numerals 2 and 3 are connected together, etc. The tube 33 includes two separate anodes 52 and 54 which are coupled to power supply *Vs* and are operated in conjunction with the other circuit elements, in a manner to be described, to select the proper cathode glow electrode 48 at any instant during the counting cycle.

Each collector electrode 40 is connected to one pair of cathode indicator electrodes in the biquinary tube 33. Thus, the collector of 30A is connected by lead 40A to cathodes 0 and 1; the collector of 30B, the next in order, is connected by lead 40B to cathodes 2 and 3, etc. Each collctor is also coupled through a capacitor 90 to the base electrode of the next adjacent higher order transistor in the counting order. Each collector is also coupled through a diode 58 back to each base electrode except its own and except that of the next adjacent transistor in the counting order. Thus, lead 40A is coupled to the cathodes of diodes 58C, 58D, and 58E, the anodes of which are each connected through resistors 60 to the base electrodes of transistors 30C, 30D, and 30E. Lead 40B is similarly connected through diodes 58A, 58D, 58E and resistors 60 to the base electrodes of transistors 30A, 30D, and 30E, etc.

The base electrode 34 of each transistor is also connected through a suitable bias resistor 66 to a source of negative D.C. bias potential V*b*. Each base electrode is also connected to the anode of a diode 70, the cathode of which is connected through resistor 74 back to its own collector electrode.

As part of the voltage biasing arrangement for each transistor, a resistor 78 is provided between resistor 74 and resistor 60 so that, in effect, a bleeder network is provided for each transistor extending from source V*s* through resistors 44, 78, 60, and 66 to V*b*.

The flip-flop 31 may be of conventional construction using two NPN transistors and includes a single input 82 and two output lines 86 and 88 which are coupled to the anodes 52 and 54 of indicator tube 33, respectively. One of the flip-flop output lines, for example 88, is also coupled through a separate capacitor 92 to each diode 70 and thus to the base electrode of each transistor.

The circuit also includes means for resetting the counter to 0 position and for properly resetting the flip-flop. This means includes a source 100 of positive reset pulses having its output 104 coupled through a resistor 108 to the base electrode of transistor 30A. The output of the reset pulse source is also suitably coupled to the flip-flop 31 to cause the proper transistor to turn on and provide the required potential on output lead 86 to coincide with the turning on of transistor 30A.

In operation of the circuit 20, the counter is set in operation by turning on the first transistor 30A by the application of a positive pulse to its base from the reset pulse source 100. This is arranged to occur simultaneously with the presence of a positive potential on the output 86 of the flip-flop 31, this positive potential being applied to the anode 52 of indicator tube 33. When transistor 30A is turned on, its collector is reduced to about ground potential so that cathodes 0 and 1 are also reduced to about ground potential. Since only anode 52 has a positive potential applied to it, the cathode 0 is caused to exhibit cathode glow. The ground potential on collector 40 of transistor 30A is coupled through the resistors 78 and 60 to the base electrode of transistor 30B which is thereby held off, and this same potential is also coupled through lead 40A and diodes 58C, 58D, and 58E to the base electrodes of the other transistors 30C, 30D, and 30E, which are held off thereby.

When the next counting pulse is applied to the flip-flop 31, the potentials on the output leads are reversed and output lead 88 becomes generally positive and output lead 86 becomes generally negative. However, since the output lead 86 is not connected to any of the transistors, the transistors are not affected by this change and their states are not changed. However, the reverse in flip-flop output potentials also reverses the potentials on the anodes 52 and 54 so that anode 54 is now at a positive potential and anode 52 is at a negative potential. Thus, cathode numeral 1 is caused to exhibit cathode glow.

The next counting pulse applied to the flip-flop returns lead 86 to a positive potential and lead 88 to a negative potential. All of the diodes 70, except that coupled to the collector electrode of transistor 30A, are reverse-biased due to the presence of positive potential on their cathodes (from the associated collector electrode) and negative potential on their anodes (from source V*b*). The diode 70 associated with transistor 30A is near forward bias because the collector electrode of "on" transistor 30A is at about ground potential. The negative pulse thus appearing on lead 88 is coupled through the capacitor 92 and diode 70 to the base electrode of transistor 30A, which is turned off thereby. When transistor 30A is turned off, its collector electrode 40 rises to a positive potential and this potential is coupled through capacitor 90 to the base electrode of transistor 30B, which is thus caused to turn on. When transistor 30B is turned on, its collector electrode 40 is reduced to about ground potential, as are cathodes 2 and 3. Since a positive potential is present on anode, 52, cathode 2 exhibits cathode glow. The next counting pulse applied to the flip-flop reverses the potentials on the anodes 52 and 54 and causes cathode numeral 3 to glow. In this manner, each input pulse applied to the flip-flop causes one after the other of the cathodes to glow in order.

The principles of the invention embodied in the circuit described above may be employed in a modified circuit such as that shown in FIG. 2. The circuit of FIG. 2 includes the counting chain and coupling arrangement between the counting transistors as shown in FIG. 1, with the circuit modifications residing primarily in the arrangement for applying input counting pulses and the utilization or indicator means coupled to each counting stage. The circuit of FIG. 2 includes many of the elements of FIG. 1, and where the same elements are employed, they carry the same reference numerals.

A counting chain embodying the principles of the invention may include substantially any desired number of counting steps. For purposes of illustration, only four counting steps, including transistors 30A, 30B, 30C, and 30D, are shown in FIG. 2. Each transistor includes base, emitter, and collector electrodes 34, 38, and 40, respectively, with each collector electrode being coupled to the diode matrix and to the inputs of others of the counting stages as described above with respect to FIG. 1. In addition, each collector electrode may be coupled to any suitable utilization device, for example, a printing mechanism, a decimal indicator tube such as the type 6844A, which is shown in FIG. 2, or the like. Each collector electrode is also coupled through the same resistor-capacitor circuitry to the next adjacent transistor 30 in the counting chain. In FIG. 2, a single-ended input count pulse source 200 is coupled through lead 88 and capacitor 92 and diode 70 to the base electrode of each transistor 30.

In operation of the circuit of FIG. 2, the execution of a counting cycle is the same as that described above except that each count pulse 204 generated by the count pulse source is registered in the counter and causes the count to proceed from one transistor 30 to the next transistor. Thus, the circuit of FIG. 1 is suitable for digital counting and display as opposed to the binary counting and biquinary display of FIG. 1.

The invention described herein provides a novel counter circuit using semiconductor devices coupled together in novel fashion to form a counting chain.

What is claimed is:

1. A counting circuit including a plurality of counting devices interconnected to form a series of counting steps, each counting device including input and output means, a count pulse source coupled through a diode to the input means of each counting device, the output means of each counting device being coupled to the input of every other counting device except that of the next adjacent device in the counting series, the output means of each counting device also being coupled through a resistor and said diode to its own input and through parallel resistive and capacitive paths to the input means of the next adjacent device in the counting series so that when a counting device performs a counting operation, it applies a first control potential to the next adjacent device and when it completes a counting operation, it applies a second control potential to the next adjacent device, the above-described connections between each output means and each of the other counting devices causing the counting operation to proceed from device to device in the desired direction in the counting series.

2. A counting circuit including a plurality of counting devices interconnected to form a series of counting steps, each counting device including input and output means, a count pulse source coupled through a capacitor and diode to the input means of each counting device, the output means of each counting device being coupled to the input of every other counting device except that of the next adjacent device in the counting series, the output means of each counting device also being coupled through a resistor and said diode to its own input and through parallel resistive and capacitive paths to the input means of the next adjacent device in the counting series so that when a counting device performs a counting operation, it applies a first control potential to the next adjacent device and when it completes a counting operation, it applies a second control potential to the next adjacent device, the above-described connections between each output means and each of the other counting devices causing the counting operation to proceed from device to device in the desired direction in the counting series.

3. The counting circuit defined in claim 2 wherein said diode is oriented to couple a negative pulse from said source of counting pulses to the input means of each counting device.

4. The circuit defined in claim 2 wherein each counting device is a transistor having a base electrode connected as its input and a collector electrode connected as its output.

5. A counting circuit including a plurality of counting devices interconnected to form a series of counting steps, each counting device including input and output electrode means, a source of counting pulses coupled to the input electrode means of each counting device, the output of each counting device being coupled through a diode matrix to the input of all but the next adjacent counting device so that each counting device which is in a counting state prevents all other devices to which it is connected from entering the counting state, the output of each counting device also being coupled to two parallel paths, the one path extending through a gate device to its own input and the other path extending to the input of the next adjacent counting device, the one path being operative when a counting device is in the state of registering a count and the other path being operative when the counting operation is transferred from one device to the next in the counting series.

6. The circuit defined in claim 5 wherein said gate device is a diode oriented to couple a counting pulse from said counting pulse source to the input electrodes of said counting devices.

7. The circuit defined in claim 5 wherein each counting device is a transistor having a base electrode connected as its input and a collector electrode connected as its output.

8. A counting circuit including a plurality of counting devices interconnected to form a series of counting steps, each counting device including input and output electrode means, a source of counting pulses coupled to the input electrode means of each counting device, the output of each counting device being coupled through a diode matrix to the input of a selected group of counting devices, the selected group including all but the next adjacent counting device, the output of a device which is performing a counting operation applying a potential to the inputs of the devices of said selected group which prevents these devices from entering the counting state, the output of each counting device also being coupled through two parellel paths to the input of the next adjacent counting device, one path being operative when a counting device is in the state of registering a count to couple a disabling potential to the adjacent device and the other path being operative when the counting operation is transferred from one device to the next in the counting series to couple an enabling potential to the next adjacent device which causes it to register a count.

9. The circuit defined in claim 8 and including a circuit connection from the output to the input of each counting device for coupling a potential from the output to the input of a device which is registering a count to prime the device to receive a signal to end its count registering operation and thereby to transfer the count-registering operation to the next adjacent device.

10. A counting circuit including a plurality of counting devices interconnected to form a series of counting steps, each counting device including an input and output electrode, a count pulse source coupled through a separate gate device to the input electrode of each counting device, the output electrode of each counting device being coupled through: a first connection to its gate device whereby a potential may be applied thereto, a second connection through an impedance path to the input electrode of the next adjacent device in the counting series whereby a potential may be coupled thereto, and a third connection through a diode matrix to the input of every other counting device except that of the next adjacent device in the counting series, each counting device thus being connected so that when it is registering a count, it couples a disabling potential through said third connection to every other device but the adjacent device and through said second connection to the adjacent device whereby all other devices are prevented from registering a count, said first connections being such that when a counting device is in the state of registering a count, its gate device is biased near its conductive state and can pass an input count pulse from said pulse source, said gate devices of all other devices which are not registering a count being strongly reverse-biased so that they cannot pass an input pulse, each input pulse when applied to all of said devices being coupled only to the device which is registering a count and serving to disable this counting device, the disabling of the counting device causing a count-registering potential to be coupled through the second connection to the next adjacent device which is thus caused to register a count.

11. The circuit defined in claim 10 wherein each gate device is a diode oriented to pass an input count pulse to a device which is registering a count.

12. The circuit defined in claim 11 wherein in said second connections, said impendance path includes a coupling capacitor.

References Cited

UNITED STATES PATENTS

| | | | |
|---|---|---|---|
| 2,801,370 | 7/1957 | Paul | 235—92 |
| 3,005,917 | 10/1961 | Hofmann | 328—49 |
| 3,010,651 | 11/1961 | Hempel | 235—92 |

MAYNARD R. WILBUR, *Primary Examiner.*

DARYL W. COOK, *Examiner.*

G. MAIER, *Assistant Examiner.*